(12) United States Patent
Cheung et al.

(10) Patent No.: US 12,266,902 B2
(45) Date of Patent: Apr. 1, 2025

(54) VERTICAL-CAVITY SURFACE-EMITTING LASER ARRAY WITH INTEGRATED CAPACITOR

(71) Applicant: Lumentum Operations LLC, San Jose, CA (US)

(72) Inventors: Siu Kwan Cheung, San Jose, CA (US); Matthew Glenn Peters, Menlo Park, CA (US); Mohammad Ali Shirazi Hosseini Dokht, Milpitas, CA (US); Hao Huang, San Jose, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 837 days.

(21) Appl. No.: 17/305,140

(22) Filed: Jun. 30, 2021

(65) Prior Publication Data
US 2022/0209500 A1    Jun. 30, 2022

Related U.S. Application Data

(60) Provisional application No. 63/131,185, filed on Dec. 28, 2020.

(51) Int. Cl.
| | |
|---|---|
| *H01S 5/026* | (2006.01) |
| *H01S 5/042* | (2006.01) |
| *H01S 5/183* | (2006.01) |
| *H01S 5/42* | (2006.01) |

(52) U.S. Cl.
CPC ........ *H01S 5/0261* (2013.01); *H01S 5/04256* (2019.08); *H01S 5/0428* (2013.01); *H01S 5/423* (2013.01); *H01S 5/18311* (2013.01); *H01S 2301/176* (2013.01)

(58) Field of Classification Search
CPC ...... H01S 5/026; H01S 5/0261; H01S 5/0265; H01S 5/0425–0428; H01S 5/183–18397
See application file for complete search history.

(56) References Cited

U.S. PATENT DOCUMENTS

| | | | | |
|---|---|---|---|---|
| 4,845,723 | A * | 7/1989 | Heinen ................. | H01S 5/4025 372/50.1 |
| 5,757,027 | A * | 5/1998 | Kuchta ............. | G01R 31/2822 372/50.1 |
| 6,774,448 | B1 | 8/2004 | Lindemann et al. | |
| 9,346,441 | B2 | 5/2016 | Rasbornig et al. | |
| 2002/0056852 | A1* | 5/2002 | Scott ..................... | H01L 31/125 257/184 |
| 2004/0188793 | A1* | 9/2004 | Lindemann ......... | H01L 27/1485 257/E27.157 |
| 2004/0247005 | A1* | 12/2004 | Schrodinger ......... | H01S 5/0261 372/38.1 |

(Continued)

*Primary Examiner* — Sean P Hagan
(74) *Attorney, Agent, or Firm* — Harrity & Harrity, LLP

(57) ABSTRACT

An optical chip may include a vertical-cavity surface-emitting laser (VCSEL) structure. The optical chip may include a capacitor over at least a portion of an active layer of the VCSEL structure that is outside of an active region of the VCSEL structure. The capacitor may include a first metal layer over the portion of the active layer, a dielectric layer on the first metal layer, and a second metal layer on the dielectric layer. The optical chip may include an isolation region between a substrate of the VCSEL and a portion of the capacitor outside of the VCSEL.

20 Claims, 17 Drawing Sheets

(56) References Cited

U.S. PATENT DOCUMENTS

| | | | |
|---|---|---|---|
| 2006/0186396 A1* | 8/2006 | Hiramatsu | H01S 5/18311 257/9 |
| 2013/0026541 A1* | 1/2013 | Kurokawa | H01L 27/0605 257/532 |
| 2016/0156157 A1* | 6/2016 | Matsubara | H01S 5/0042 438/18 |
| 2019/0181609 A1* | 6/2019 | Yuen | H01S 5/1833 |

* cited by examiner

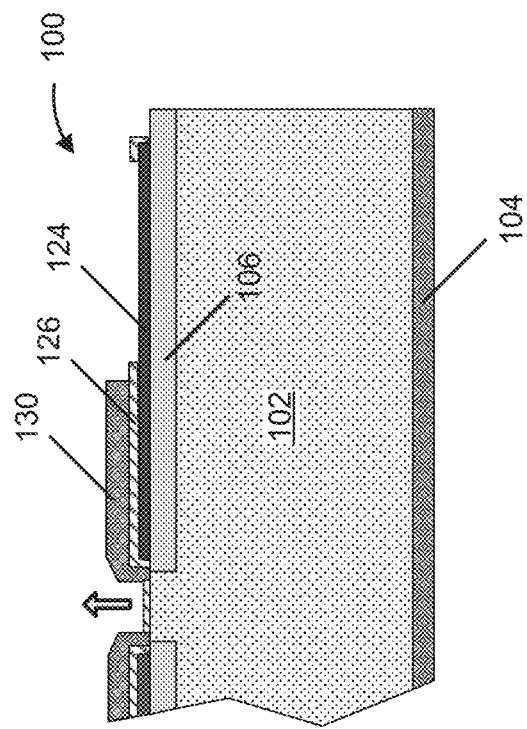
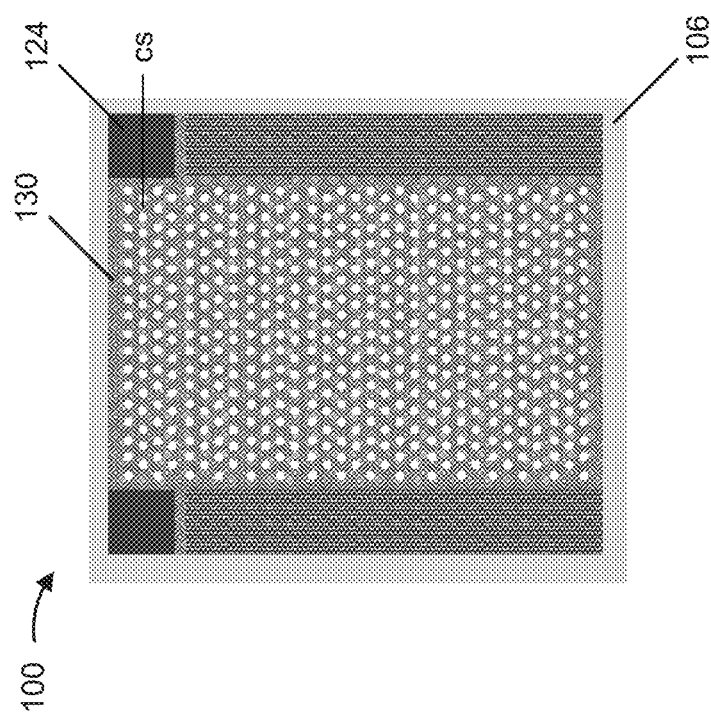
FIG. 11A
FIG. 11B

VERTICAL-CAVITY SURFACE-EMITTING LASER ARRAY WITH INTEGRATED CAPACITOR

CROSS-REFERENCE TO RELATED APPLICATION

This Patent Application claims priority to U.S. Provisional Patent Application No. 63/131,185, filed on Dec. 28, 2020, and entitled "CAPACITIVELY CHARGED VERTICAL-CAVITY SURFACE-EMITTING LASER ARRAY." The disclosure of the prior Application is considered part of and is incorporated by reference into this Patent Application.

TECHNICAL FIELD

The present disclosure relates generally to a vertical-cavity surface-emitting laser (VCSEL) chip and, more particularly, to a VCSEL chip with one or more integrated capacitors to enable a sub-nanosecond pulse mode with fast rise times at high current operation.

BACKGROUND

An optical system, such as a time-of-flight (ToF)-based measurement system, requires high power optical pulses of short duration (e.g., 10 nanoseconds (ns) or less), and fast rise and fall time of transient response. High power optical pulses enable greater distance range finding, and shorter duration optical pulses enable improved resolution. For a vertical-cavity surface-emitting laser (VCSEL), a higher electrical current across the VCSEL corresponds to a higher power optical pulse. In general, a ToF-based measurement system determines distances to objects and/or object depth by measuring delays between an emitted optical pulse and a reflected optical pulse, where the emitted optical pulses have a well-defined origin in time and a rectangular shape that simplifies measurement. To achieve a rectangular shape, emitted optical pulses should have short rise times (e.g., a time during which power of the optical pulse is rising from zero to peak power) and short fall times (e.g., a time during which power of the optical pulse is falling from peak power to zero).

SUMMARY

In some implementations, an optical chip includes a VCSEL structure, and a capacitor over at least a portion of an active layer of the VCSEL structure that is outside of an active region, the capacitor including: a first metal layer over the portion of the active layer, a dielectric layer on the first metal layer, and a second metal layer on the dielectric layer; and an isolation region between a substrate of the VCSEL structure and a portion of the capacitor outside of the VCSEL structure.

In some implementations, a device includes a VCSEL array; a capacitor integrated with an electrode of the VCSEL array, the capacitor comprising a first portion, a second portion, and a third portion, wherein the first portion of the capacitor is over a portion of a top surface of a VCSEL structure of the VCSEL array that is outside of an active region of the VCSEL structure, wherein the second portion of the capacitor is on a side surface of the VCSEL structure of the VCSEL array, and wherein the third portion of the capacitor is adjacent to the VCSEL structure of the VCSEL array; and an isolation region between the third portion of the capacitor and a substrate of the VCSEL array.

In some implementations, a method includes forming an isolation region in a region of a substrate of a VCSEL chip that is outside of a VCSEL structure of the VCSEL chip; forming a first metal layer over the isolation region, on a side-surface of the VCSEL structure, and over a top surface of the VCSEL structure; forming a dielectric layer on the first metal layer; and forming a second metal layer on the dielectric layer, wherein the first metal layer, the dielectric layer, and the second metal layer form a parallel plate capacitor that extends over at least a portion of an active layer of the VCSEL structure.

BRIEF DESCRIPTION OF THE DRAWINGS

FIGS. 10A-10D, 11A, and 11B are diagrams associated with example steps for fabrication of the integrated capacitor in a VCSEL chip, as described herein.

DETAILED DESCRIPTION

Figure 1:
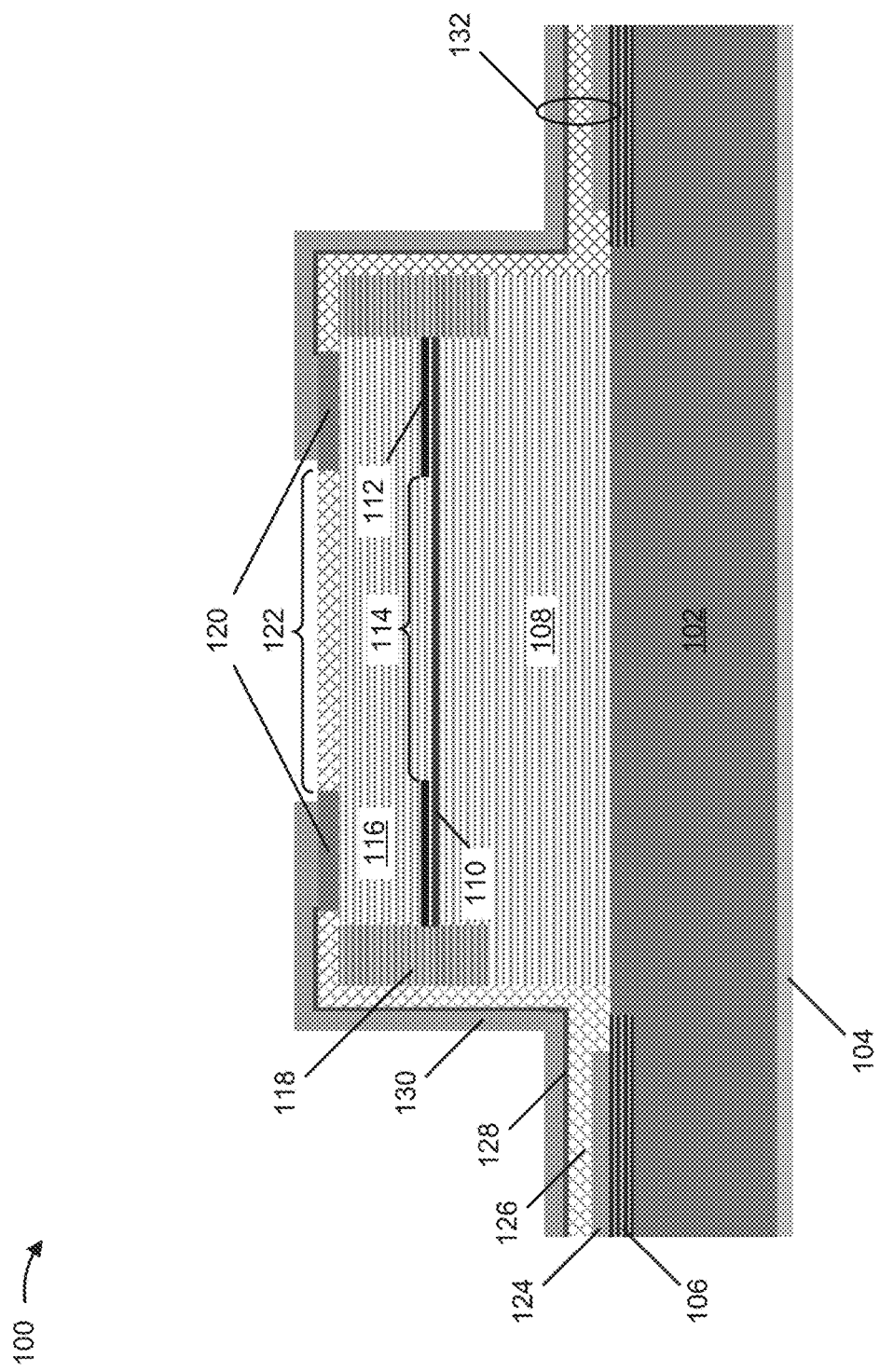
FIG. 1 is a diagram of an example implementation of a VCSEL chip including an integrated capacitor, as described herein.

The following detailed description of example implementations refers to the accompanying drawings. The same reference numbers in different drawings may identify the same or similar elements.

A driver circuit associated with driving a VCSEL chip can in some cases include a capacitor (e.g., a capacitor arranged on a printed circuit board (PCB)) in order to enhance performance of the VCSEL chip. For example, the capacitor may be configured to act as a charge reservoir associated with driving the VCSEL chip. However, while some performance benefit may be achieved with the use of an external capacitor, parasitic inductance and resistance along a current path between the external capacitor and the VCSEL chip means that performance is not optimized. For example, the parasitic inductance and resistance along the current path between the external capacitor and the VCSEL chip lowers an operating current, decreases response times of the VCSEL chip, and reduces a driving efficiency of the VCSEL chip, in particular for high current operation.

Some aspects described herein provide a VCSEL chip including an integrated capacitor. In some implementations, the integrated capacitor is in the form of two metal layers with a dielectric layer between, to form a metal-insulator-metal (MIM) capacitor or a metal-oxide-metal (MOM) capacitor. In some implementations, a metal layer of a given integrated capacitor is a portion of a metal layer used in association with operating the VCSEL chip. For example, a metal layer of a given integrated capacitor may be a portion of an anode metal of the VCSEL chip (e.g., when the integrated capacitor is integrated at an anode of the VCSEL chip). Similarly, a metal layer of a given integrated capacitor may be a portion of a cathode metal of the VCSEL chip (e.g., when the given integrated capacitor is integrated at the cathode of the VCSEL chip). Additional details and particular implementations of the integrated capacitor are described below.

In general, the integration of the capacitor on the VCSEL chip reduces or minimizes inductance and resistance between the capacitor and the VCSEL chip (e.g., as compared to an external capacitor), which in turn increases operating current, switching speed, and driving efficiency. For example, in some implementations, the integrated capacitor can be configured in series with the VCSELs such that the integrated capacitor acts as a charge reservoir. Here, the integration of the capacitor on the VCSEL chip reduces or minimizes inductance and resistance between the integrated capacitor and the VCSELs to enable sharp and ultra-narrow pulse operation (when the integrated capacitor discharges a stored charge through the VCSELs).

As another example, in some implementations, an integrated capacitor can be configured in parallel with the VCSELs such that the integrated capacitor acts as a high-speed capacitor (e.g., with a relatively small capacitance and size). Here, the integration of the capacitor on the VCSEL chip acts as an impedance matching circuit between the VCSEL chip and an external inductive circuit to provide a wide bandwidth to support higher harmonics of a rectangular pulse to sharpen edges of the optical pulse and, therefore, decrease a rise and fall times of the optical pulse. For example, an optical pulse is a summation of a fundamental frequency and higher order harmonic components of the fundamental frequency. Allowing higher frequency components to pass through the VCSELs requires a wideband circuit that allows steep transient response at both rise times and fall times of the optical pulse. By driving a circuit with a lower parasitic impedance, a wider frequency bandwidth is supported and, therefore, higher harmonic frequency components of the optical pulse are allowed to pass through the VCSELs, meaning that faster rise and fall times for optical pulses are achieved.

FIG. 1 is a diagram of an example implementation of a VCSEL chip 100 including an integrated capacitor. FIG. 1 illustrates a single VCSEL structure (e.g., a single emitter) on the VCSEL chip 100, and the VCSEL chip 100 may include one or more additional VCSEL structures having a structure similar to that shown and described in association with FIG. 1. As shown in FIG. 1, the VCSEL chip 100 includes a substrate 102, a bottom metal layer 104, an isolation region 106, a bottom mirror 108, an active layer 110, an oxide layer 112 that defines an oxide aperture 114, a top mirror 116, an isolation region 118, a contact layer 120, and an optical aperture 122. Here, the VCSEL structure shown in FIG. 1 is a structure including the bottom mirror 108, the active layer 110, the oxide layer 112, the oxide aperture 114, the top mirror 116, the isolation region 118, and the optical aperture 122. Other VCSEL structures of the VCSEL chip 100 may have a similar structure to that of the VCSEL structure shown in FIG. 1. In some implementations, other VCSEL structures may be used, such as multi-junction emitters, or other VCSEL structures having different configurations of layers, mirrors and/or regions. As further shown, the VCSEL chip 100 includes a capacitor layer 124, a dielectric layer 126, an adhesive layer 128, and a top metal layer 130. As indicated in FIG. 1, in some regions of the VCSEL chip 100 (e.g., adjacent to the VCSEL structure shown in FIG. 1), a capacitor 132 is formed. That is, in some regions of the VCSEL chip 100 a capacitor 132 is integrated in the VCSEL chip 100. In the example shown in FIG. 1, a layer stack comprising the capacitor layer 124, the dielectric layer 126, and the top metal layer 130 form the capacitor 132. Notably, in some implementations, and depending on a layout structure of the VCSEL chip 100, the capacitor 132 can be formed in one or more regions of the surface of the VCSEL chip 100 other than a region of the optical aperture 122. In some implementations, depending on a particular layout structure of the VCSEL chip 100, metallic layers in the form of multiple MIMs (e.g., a MIMIM structure) can be formed.

The substrate 102 includes a substrate on which an array of VCSELs is formed. In some implementations, other layers of the VCSEL chip 100 are grown on the substrate 102. In some implementations, the substrate 102 may be formed from a semiconductor material, such as gallium arsenide (GaAs), indium phosphide (InP), or another type of semiconductor material. In some implementations, the substrate 102 comprises an n-type material (e.g., n-type GaAs).

The bottom metal layer 104 is a metal layer on a bottom surface of the substrate 102 (e.g., at a backside of the VCSEL chip 100). The bottom metal layer 104 is a layer that makes electrical contact with the substrate 102. In some implementations, the bottom metal layer 104 is a cathode of the VCSEL chip 100. In some implementations, the bottom metal layer 104 may include an annealed metallization layer, such as a gold-germanium-nickel (AuGeNi) layer or a palladium-germanium-gold (PdGeAu) layer, among other examples.

The isolation region 106 is a region configured to provide isolation between the capacitor 132 and the substrate 102. For example, in some implementations, the isolation region 106 may be configured to prevent current leakage from the capacitor 132 to the substrate 102. In some implementations, the isolation region 106 may be configured to reduce capacitive coupling between the capacitor 132 and the substrate 102. In some implementations, as illustrated in FIG. 1, the isolation region 106 is between the substrate 102 and the capacitor 132 (e.g., adjacent to the VCSEL structure of the VCSEL chip 100). In some implementations, the isolation region 106 can be formed in the substrate 102 using, for example, an ion implantation process or a diffusion process.

The bottom mirror 108 is a bottom reflector of an optical resonator in the VCSEL structure of the VCSEL chip 100. For example, the bottom mirror 108 may include a distributed Bragg reflector (DBR), a dielectric mirror, or another type of mirror structure. In some implementations, the bottom mirror 108 is formed from an n-type material. In some implementations, the bottom mirror 108 includes a set of layers (e.g., aluminum gallium arsenide (AlGaAs) layers) grown using a metal-organic chemical vapor deposition (MOCVD) technique, a molecular beam epitaxy (MBE) technique, or another technique.

The active layer 110 includes one or more layers where electrons and holes recombine to emit light and define the emission wavelength range of the VCSEL chip 100. For example, the active layer 110 may include one or more quantum wells. In some implementations, the active layer

110 may include one or more cavity spacer layers between the top mirror 116 and the bottom mirror 108. The optical thickness of the active layer 110 (including cavity spacer layers) and optical thickness of the top mirror 116 and the bottom mirror 108 define the resonant cavity wavelength of the VCSEL chip 100, which may be designed within an emission wavelength range of the active region to enable lasing. In some implementations, the active layer 110 may be a single p-i-n junction with an intrinsic (i) region with light-emitting quantum wells. Alternatively, in some implementations, the active layer 110 may be a multi-junction active region—a series of p-i-n junctions connected by tunnel junctions with a layer stack from (bottom-to-top) of p-i-n/n++/p++/p-i-n/n++/p++/p-i-n, where each intrinsic region includes light-emitting quantum wells. In some implementations, the active layer 110 includes a set of layers grown using an MOCVD technique, an MBE technique, or another technique.

The oxide layer 112 includes an oxide layer that forms the oxide aperture 114 for providing optical and electrical confinement for the VCSELs of the VCSEL chip 100. In some implementations, the oxide layer 112 is formed as a result of oxidation of one or more epitaxial layers of the VCSEL chip 100. For example, the oxide layer 112 may be an aluminum oxide ($Al_2O_3$) layer formed as a result of oxidation of an epitaxial layer (e.g., an AlGaAs layer, an aluminum arsenide (AlAs) layer, and/or the like). In some implementations, oxidation trenches (e.g., adjacent to the VCSEL structure shown in FIG. 1) etched around the VCSELs in the VCSEL chip 100 may allow steam or gas to access the epitaxial layer(s) from which the oxide layer 112 is formed. In some implementations, the oxide layer 112 is formed such that that oxide aperture 114 has a circular shape. In some implementations, the oxide layer 112 is formed such that the oxide aperture 114 has a non-circular shape.

The top mirror 116 is atop reflector of the optical resonator in the VCSEL structure of the VCSEL chip 100. For example, the top mirror 116 may include a DBR, a dielectric mirror, or another type of mirror structure. In some implementations, the top mirror 116 is formed from a p-type material. In some implementations, the top mirror 116 includes a set of layers (e.g., AlGaAs layers) grown using a MOCVD technique, a MBE technique, or another technique.

The isolation region 118 is an isolation region configured to prevent free carriers from reaching edges of trenches of the VCSEL structures of the VCSEL chip 100 and/or to isolate adjacent VCSEL structures in the VCSEL chip 100 from one another (e.g., when the VCSELs are not fully enclosed by trenches). In some implementations, the isolation region 106 can be formed in epitaxial layers of the VCSEL chip 100 using, for example, an ion implantation process or a diffusion process.

The contact layer 120 is atop contact layer of the VCSEL chip 100 that makes electrical contact with the top mirror 116 through which current may flow. In some implementations, the contact layer 120 includes an annealed metallization layer. For example, the contact layer 120 may be a titanium-gold (Ti—Au) layer, a nickel-gold (Ni—Au) layer, or the like. In some implementations, the contact layer 120 has a ring shape, a slotted ring shape, a tooth wheel shape, or another type of circular or non-circular shape (e.g., depending on a design of the VCSEL structures in the VCSEL chip 100).

The optical aperture 122 is an aperture in the VCSEL structure of the VCSEL chip 100 through which light is emitted. In some implementations, as indicated in FIG. 1, a size or a shape of the optical aperture 122 may be at least partially defined by the contact layer 120. In some implementations, as shown, a portion of the dielectric layer 126 may be formed over or in the optical aperture 122. In some implementations, the portion of the dielectric layer 126 over or in the optical aperture 122 may be a portion of the dielectric layer 126 remaining over or in the optical aperture 122 after the dielectric layer 126 is etched in association with forming the contact layer 120.

The capacitor layer 124 is a conductive layer that forms a portion of the capacitor 132 that is integrated in the VCSEL chip 100. In some implementations, the capacitor layer 124 may comprise, for example, gold, nickel, titanium, platinum, copper, one or more other metallic materials, or one or more other conductive materials. As shown in FIG. 1, in some implementations, the capacitor layer 124 is formed on or over the isolation region 106 of the VCSEL chip 100. Additionally, in some implementations, the capacitor layer 124 is formed over one or more portions of the VCSEL structure. In some implementations, a thickness of the capacitor layer 124 may be in a range from approximately 0.5 µm to approximately 3 µm, such as 2 µm. The thickness of the capacitor layer 124 can in some cases be selected in association with providing mechanical performance during post-processing of the VCSEL chip 100, such as wire bonding and probing.

The dielectric layer 126 includes one or more layers of insulating material. A purpose or function of a given portion of the dielectric layer 126 may depend on a region in which the given portion of the dielectric layer 126 is located. For example, in the implementation shown in FIG. 1, a portion of the dielectric layer on a side-surface of the VCSEL structure between the top metal layer 130 and the side-surface of the VCSEL structure may be configured to provide isolation of the VCSEL structure from the top metal layer 130. As another example, a portion of the dielectric layer 126 between the capacitor layer 124 and the top metal layer 130 may be configured to act as a dielectric layer in the capacitor 132. As another example, a portion of the dielectric layer 126 over or in the optical aperture 122 may be configured to protect lower layers of the VCSEL structure from being damaged. In some implementations, one or more types of dielectric material in the dielectric layer 126 or thicknesses of one or more dielectric materials in the dielectric layer 126 may vary among the different portions of the dielectric layer 126. In some implementations, the VCSEL chip 100 may include one or more dielectric layers 126. In some implementations with more types of dielectric material in the dielectric layers 126, the dielectric layers can be arranged in parallel or in series with respect to a field line between the plates of the capacitor 132.

In some implementations, the dielectric layer 126 comprises a dielectric material with a relatively high dielectric constant (e.g., material with a dielectric constant that is greater than or equal to approximately 100), such as titanium dioxide ($TiO_2$), barium titanate ($BaTiO_3$, also referred to as BT), barium strontium titanate ($BaSrTiO_3$, also referred to as BST), or Strontium titanate ($SrTiO_3$), among other examples. Additionally, or alternatively, the dielectric layer 126 may comprise a dielectric material with a relatively lower dielectric constant, such as silicon nitride ($Si_xN_y$, such as $Si_3N_4$) or silicon dioxide ($SiO_2$), among other examples. In some implementations, the dielectric layer 126 may comprise two or more layers of dielectric material, where types or thicknesses of dielectric material vary among the two or more layers of dielectric material. In some implementations, a type of the dielectric material(s) or a thickness of the dielectric material(s) in the dielectric layer 126 may be selected so as to cause the capacitor 132 to provide a desired capacitance (e.g., a capacitance greater than approximately 100 picofarads (pF), a capacitance in a range from approximately 0.1 nanofarads (nF) to approximately 50 nF) or other characteristic. In some implementations, a thickness of the dielectric layer 126 may be in a range from approximately 50 angstrom (A) to approximately 1 μm, such as 0.1 μm. In some implementations, the thickness of the dielectric materials may be selected based on a breakdown voltage for specific operations.

The adhesive layer 128 is a layer associated with bonding the top metal layer 130 to the dielectric layer 126. In some implementations, the adhesive layer 128 is an organic material (e.g., benzocyclobutene (BCB)) or an inorganic material. In some implementations, the adhesive layer 128 is deposited on the dielectric layer 126 prior to deposition of the top metal layer 130 in order to provide bonding of the top metal layer 130 to the dielectric layer 126).

The top metal layer 130 is a metal layer of the VCSEL chip 100 (e.g., at a frontside of the VCSEL chip 100). The top metal layer 130 is a layer that makes electrical contact with the contact layer 120 in association with operation of the VCSEL chip 100 to emit light. In some implementations, the top metal layer 130 is an anode of the VCSEL chip 100. In some implementations, the top metal layer 130 may include, for example, gold, nickel, titanium, platinum, copper, one or more other metallic materials, or one or more other conductive materials. In some implementations, a thickness of the top metal layer 130 may be in a range from approximately 1 μm to approximately 3 μm, such as 3 μm. In some implementations, the thickness of the metal layer 130 may be equal to or near a highest metallization thickness available for a given fabrication process in order to provide a lowest possible resistivity.

In some implementations, a portion of the top metal layer 130 is a conductive layer that forms a portion of the capacitor 132 that is integrated in the VCSEL chip 100. That is, in some implementations, a portion of the top metal layer 130 is configured to act as a conductive layer in the capacitor 132. For example, as shown in FIG. 1, a portion of the top metal layer 130 over the capacitor layer 124 may act as a top conductive layer of the capacitor 132.

The capacitor 132 is a capacitor integrated in the VCSEL chip 100. In some implementations, the capacitor 132 is formed from the capacitor layer 124, a portion of the dielectric layer 126, and a portion of the top metal layer 130. Therefore, in some implementations, the capacitor 132 is a parallel plate capacitor, such as a MIM capacitor or a MOM capacitor (depending on the composition of the dielectric layer 126). In some implementations, as shown in FIG. 1, the capacitor 132 is formed in a region that is adjacent to one or more VCSEL structures of the VCSEL chip 100. That is, in some implementations, the capacitor 132 is formed in a region between, around, or adjacent to one or more VCSEL structures of the VCSEL chip 100. Additionally, in some implementations, a portion of the capacitor 132 is formed over the VCSEL structure (e.g., over a portion the active layer 110). That is, in some implementations, the capacitor 132 extends near or to the optical aperture 122 of a given VCSEL structure.

Notably, the number of metal layers to implement the capacitor 132 is not limited to two metal layers and one dielectric layer. For example, in some implementations, the capacitor 132 may include multiple dielectric layers (e.g., a first dielectric layer and a second dielectric layer) separating three or more metal layers (e.g., a first capacitor layer, a second capacitor layer, and the top metal layer 130) rather than a single dielectric layer 126 separating the capacitor layer 124 and the top metal layer 130. In such an implementation, a given metal layer of the three or more metal layers of such a capacitor 132 may be electrically connected to one or more other metal layers using vias in the dielectric layers 126 or a dielectric etching process. In some implementations, such a configuration may reduce an area of a bond pad of the VCSEL chip 100 (e.g., by electrically bringing a bottom contact to a top metal layer) and provide increased capacitance for the capacitor 132 (e.g., as compared to a capacitor 132 comprising two metal layers).

In some implementations, the capacitor 132 is integrated with the anode of the VCSEL chip 100, as illustrated in FIG. 1. Alternatively, the capacitor may be integrated with the cathode of the VCSEL chip 100, various examples of which are described below. In some implementations, the VCSEL chip 100 includes a first capacitor 132a integrated with the anode of the VCSEL chip 100 and a second capacitor 132b integrated with the cathode of the VCSEL chip 100, an example of which is described below with respect to FIG. 9.

In some implementations, the capacitor 132 is connected in series with the VCSEL chip 100. In such a configuration, the capacitor 132 acts as a charge reservoir for the VCSEL chip 100. Here, the integration of the capacitor 132 on the VCSEL chip 100 reduces or minimizes inductance and resistance between the capacitor 132 and the VCSELs of the VCSEL chip 100 (e.g., as compared to an external capacitor), thereby enabling sharp and ultra-narrow pulse operation (when the capacitor 132 discharges a stored charge through the VCSELs of the VCSEL chip 100).

In some implementations, the capacitor 132 is connected in parallel with the VCSEL chip 100. In such a configuration, the capacitor 132 acts as a high-speed capacitor (e.g., with a relatively small capacitance and size). Here, the capacitor 132 acts as an impedance matching circuit between the VCSEL chip 100 and an external inductive circuit to provide a wide bandwidth to support higher harmonics of a rectangular pulse to sharpen edges of optical pulses and, therefore, decreases rise and fall times of the optical pulses. For example, an optical pulse is a summation of a fundamental frequency and higher order harmonic components of the fundamental frequency. Allowing higher frequency components to pass through the VCSELs of the VCSEL chip 100 requires a wideband circuit that allows steep transient response at both rise times and fall times of the optical pulses. By driving a circuit with a lower parasitic impedance, a wider frequency bandwidth is supported and, therefore, higher harmonic frequency components of the optical pulses are allowed to pass through the VCSELs of the VCSEL chip 100, meaning that faster rise and fall times are achieved.

In some implementations, the VCSEL chip 100 includes a first capacitor connected in series with the VCSEL chip 100 and a second capacitor connected in parallel with the VCSEL chip 100. Additional example implementations of the VCSEL chip 100 including the capacitor 132 are provided below.

The number, arrangement, thicknesses, order, symmetry, or the like, of layers shown in FIG. 1 are provided as examples. In practice, the VCSEL chip 100 may include additional layers, fewer layers, different layers, differently constructed layers, differently arranged layers, or layers of different relative thicknesses than those shown in FIG. 1. Additionally, or alternatively, a set of layers (e.g., one or more layers) of the VCSEL chip 100 may perform one or more functions described as being performed by another set of layers of the VCSEL chip 100 and, in practice, any layer may comprise more than one layer.

Figure 2:
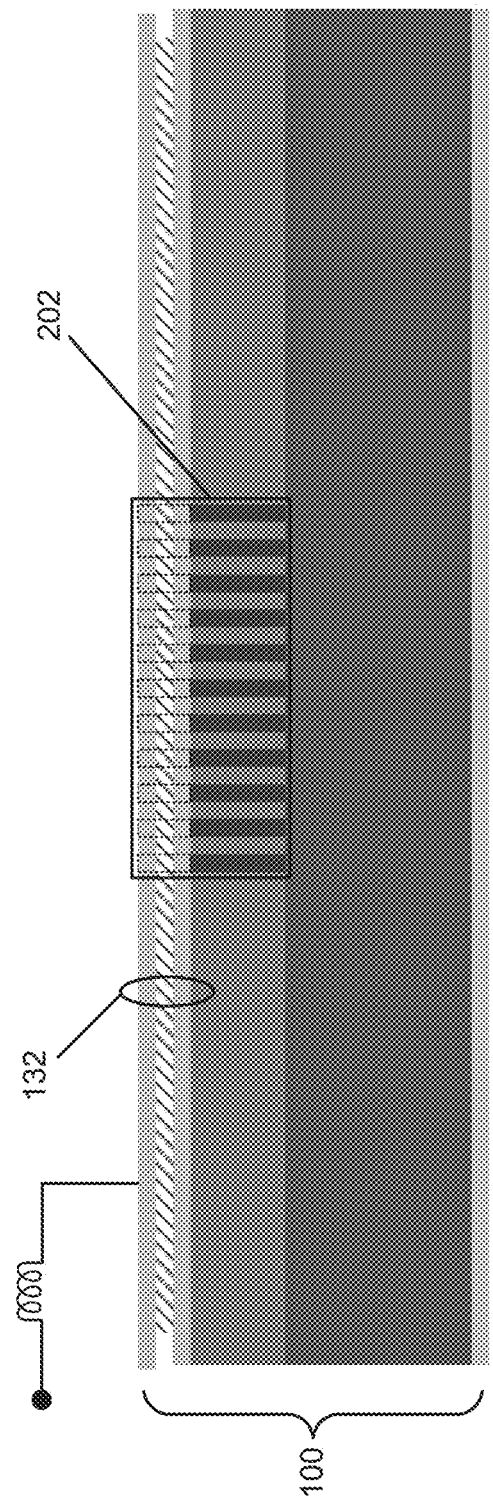
FIGS. 2-4 are diagrams illustrating integration of a capacitor at an anode and/or a cathode of a VCSEL chip, as described herein.
Figure 3:
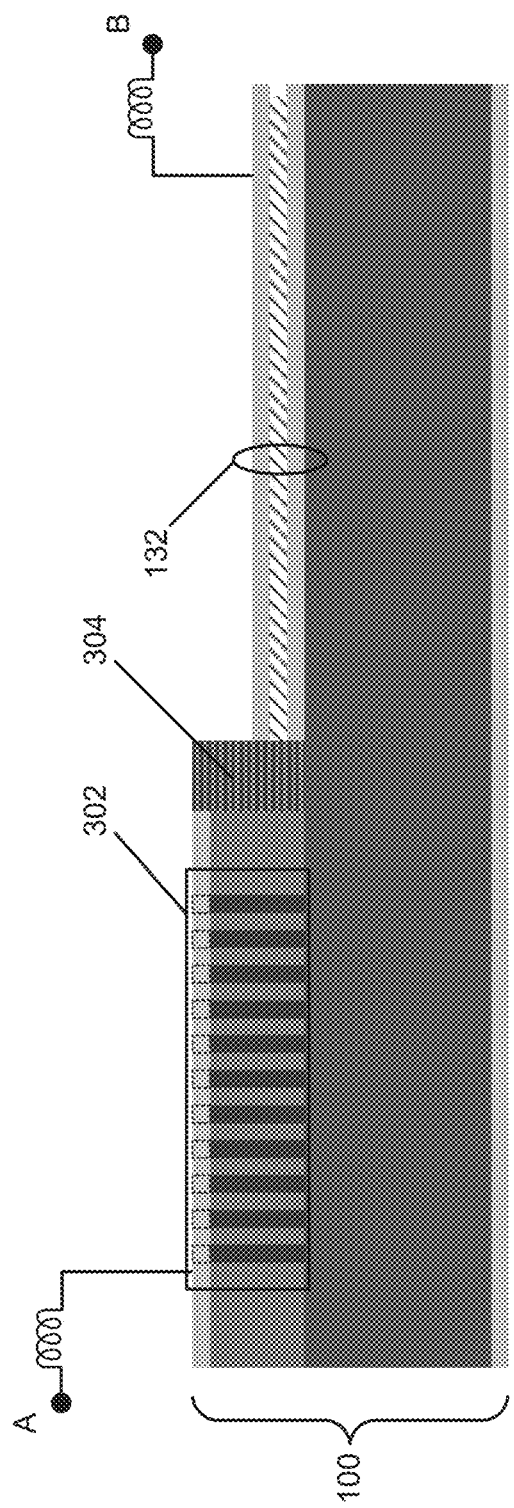
Figure 4:
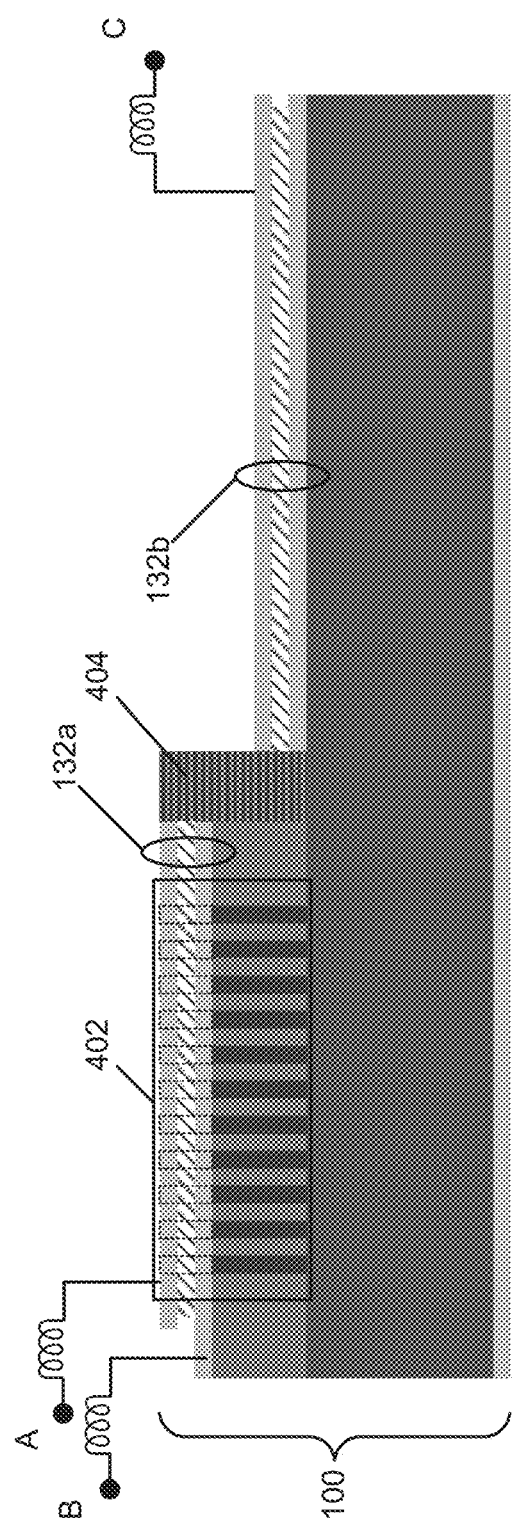

FIGS. 2-4 are diagrams conceptually illustrating integration of the capacitor 132 at the anode and/or the cathode of the VCSEL chip 100. Notably, individual layers and features of the VCSEL chip 100 other than the capacitor 132 are not identified in FIGS. 2-4.

FIG. 2 is a diagram conceptually illustrating integration of a capacitor 132 at the anode of the VCSEL chip 100. In the example shown in FIG. 2, the capacitor 132 is integrated with the anode of the VCSEL chip 100 and is connected in series with the array of VCSEL structures of the VCSEL chip 100. In the example in FIG. 2, the array of VCSEL structures is formed in an emitter region 202, and each VCSEL structure of the array of VCSEL structures is indicated by a dark gray vertically oriented rectangle and corresponding dashed rectangle. As shown in FIG. 2, the capacitor 132 may in some implementations be in regions over the emitter region 202 other than regions over apertures of the emitters in the emitter region 202. As further shown, in some implementations, the capacitor 132 may extend outside of the emitter region 202. Such a configuration enables accumulation of electrical charge for a switching operation. During switching mode, the charge stored by the capacitor 132 is fired (when a current is connected between the anode and the cathode with an external driver), thereby generating an ultra-fast current pulse at the falling edge of a driving pulse that drives the VCSEL chip 100.

FIG. 3 is a diagram conceptually illustrating integration of a capacitor 132 at the cathode of the VCSEL chip 100. In the example shown in FIG. 3, the capacitor 132 is integrated with the cathode of the VCSEL chip 100 and is connected in series with the array of VCSEL structures of the VCSEL chip 100. In the example in FIG. 3, the array of VCSEL structures is formed in an emitter region 302, and each VCSEL structure of the array of VCSEL structures is indicated by a dark gray vertically oriented rectangle and corresponding dashed rectangle. As shown in FIG. 3, the capacitor 132 may in some implementations be outside of the emitter region 302. Further, in some implementations, the capacitor 132 may be isolated from the VCSEL structures of the VCSEL chip 100 by an isolation region 304 (e.g., a region including a portion of dielectric layer 126 or one or more isolation regions of the VCSEL chip 100). Notably, the operation of the VCSEL chip 100 shown in FIG. 3 is similar to that described in association with FIG. 2, but the integrated capacitor is connected to the cathode of the VCSEL chip 100. Such an arrangement enables flexibility in impedance matching and feedback to the driver chip.

FIG. 4 is a diagram conceptually illustrating integration of capacitors 132 at both the anode of the VCSEL chip 100 and the cathode of the VCSEL chip 100. In the example shown in FIG. 4, the capacitor 132a is integrated with the anode of the VCSEL chip 100 and is connected in series with the array of VCSEL structures of the VCSEL chip 100. In the example in FIG. 4, the array of VCSEL structures is formed in an emitter region 402, and each VCSEL structure of the array of VCSEL structures is indicated by a dark gray vertically oriented rectangle and corresponding dashed rectangle. As shown in FIG. 4, the capacitor 132a may be over the emitter region 402 and, in some cases, may extend outside of the emitter region 402. As further shown in FIG. 4, the capacitor 132b is integrated with the cathode of the VCSEL chip 100 and is connected in series with the array of VCSEL structures of the VCSEL chip 100. As shown in FIG. 4, the capacitor 132b may in some implementations be outside of the emitter region 402, and may be isolated from the VCSEL structures of the VCSEL chip 100 by an isolation region 404 (e.g., a region including a portion of dielectric layer 126 or one or more isolation regions of the VCSEL chip 100). With integration of capacitors 132a and 132b at the anode and the cathode, respectively, of the VCSEL chip 100, the configuration shown in FIG. 4 improves flexibility of operation and tuning of the VCSEL chip 100 to an external circuit.

As indicated above, FIGS. 2-4 are provided as examples for conceptual illustration of integration of the capacitor 132 in the VCSEL chip 100, and other examples are contemplated.

FIGS. 5-9 are diagrams illustrating example implementations of the VCSEL chip 100 in the configurations conceptually illustrated in FIGS. 2-4.

Figure 5:
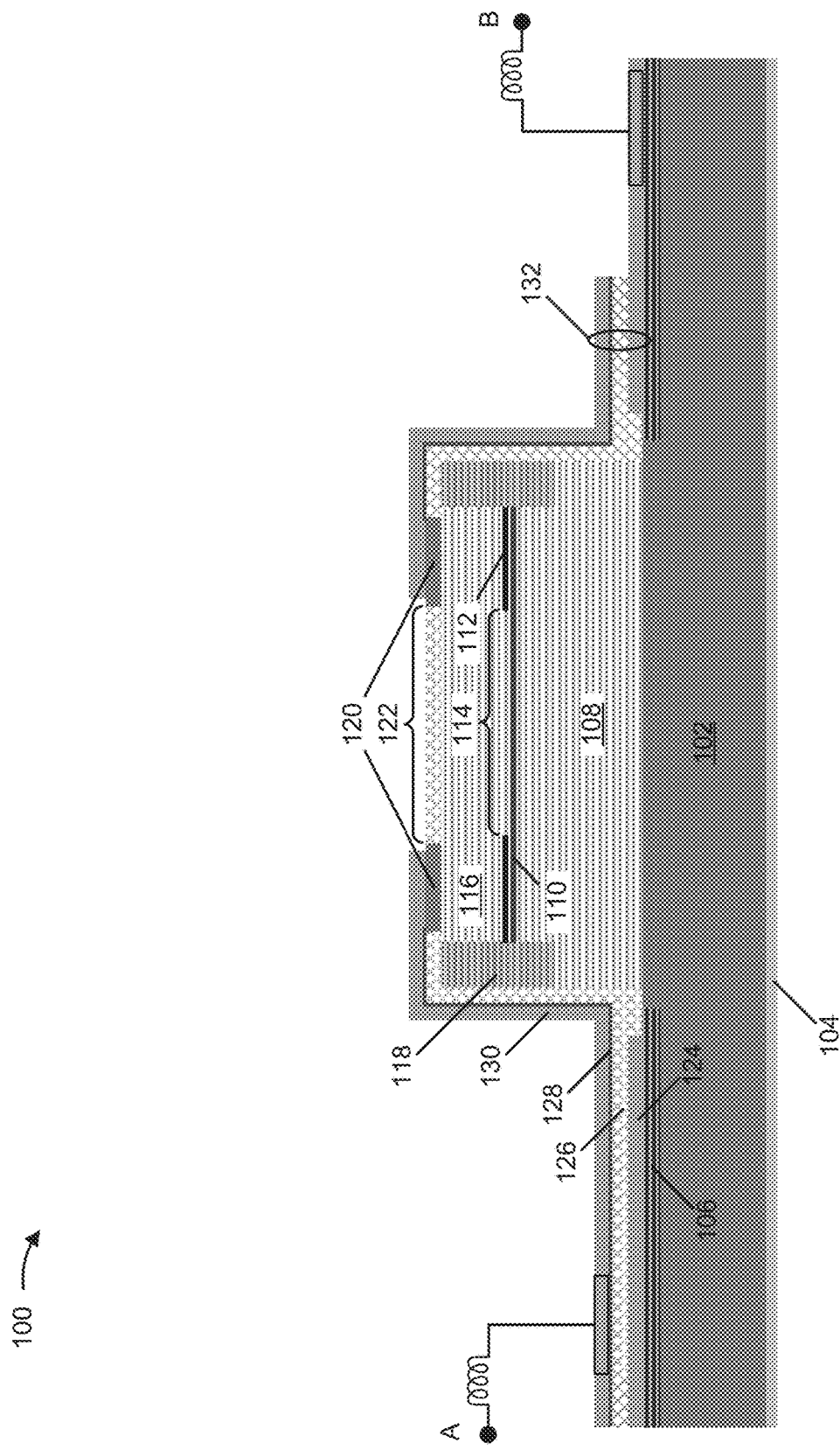
FIGS. 5-9 are diagrams illustrating example implementations of a VCSEL chip with an integrated capacitor in the configurations conceptually illustrated in FIGS. 2-4.

FIG. 5 is a diagram of an example implementation of the VCSEL chip 100 in which the capacitor 132 is integrated at the anode of the VCSEL chip 100 and is configured in series with the array of VCSEL structures of the VCSEL chip 100. Notably, the VCSEL chip 100 in FIG. 5 has two access contacts on the anode of the VCSEL chip 100—a first access contact for a wirebond connection (e.g., wirebond A) to the top metal layer 130 and a second access contact for a wirebond connection (e.g., wirebond B) to the capacitor layer 124. Here, when wirebond A is connected to a voltage source, the anode capacitor 132 is in parallel to the VCSEL chip 100. Further, when wirebond B is connected to a voltage source, the anode capacitor 132 is in series to the VCSEL chip 100.

Figure 6:
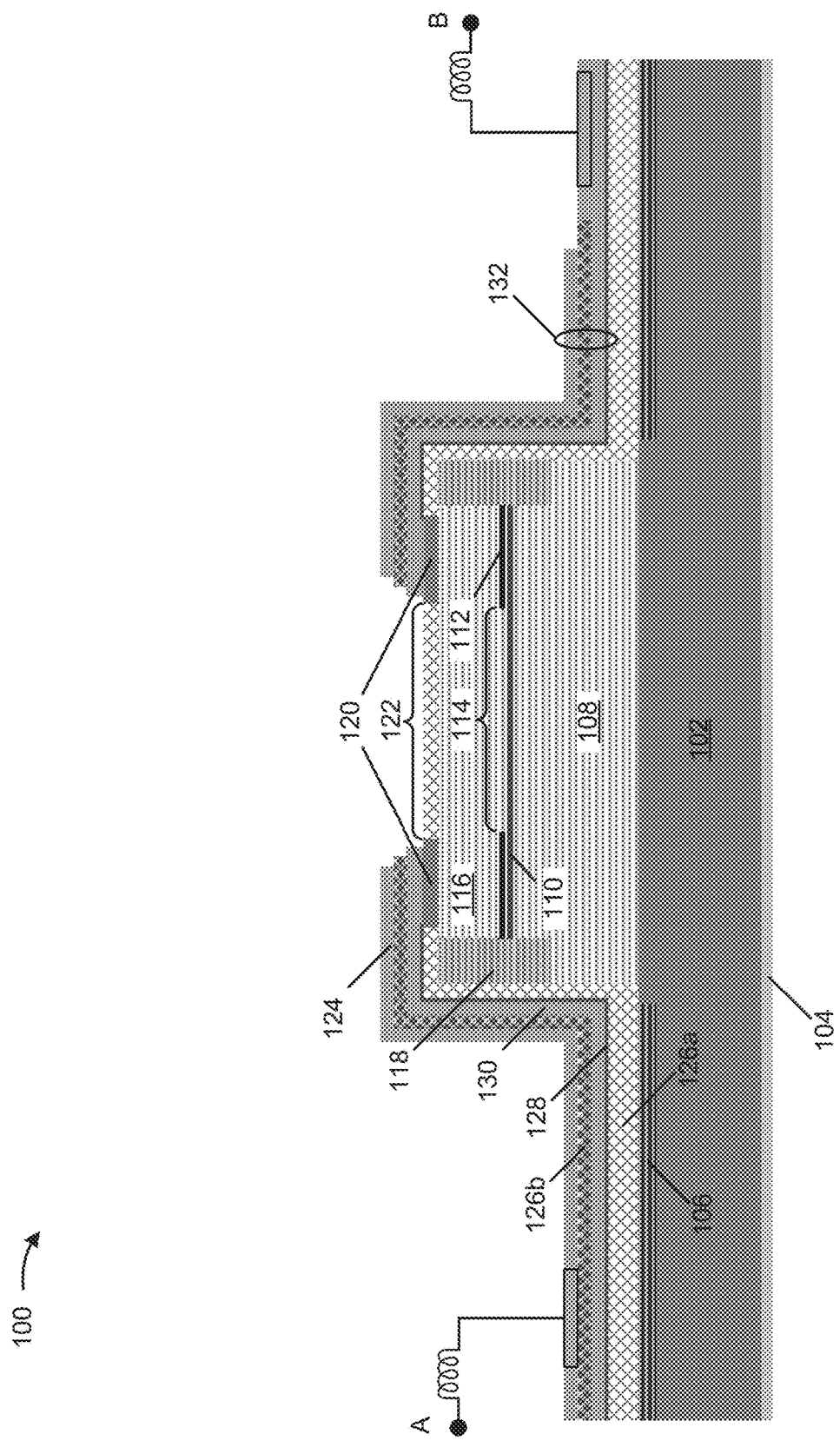

FIG. 6 is a diagram illustrating another example implementation of the VCSEL chip 100 in which the capacitor 132 is integrated at the anode of the VCSEL chip 100 and is configured in series with the array of VCSEL structures of the VCSEL chip 100. In the example implementation shown in FIG. 6, the capacitor layer 124, the dielectric layer 126b, and the top metal layer 130 form the capacitor 132. As shown, the capacitor 132 is on a surface adjacent to the VCSEL structure (e.g., over the isolation region 106), on a side-surface of the VCSEL structure (e.g., a vertically oriented side-surface of the VCSEL structure), and on a portion on a top surface of the VCSEL structure. In some implementations, as shown in FIG. 6, the capacitor 132 extends on the top surface of the VCSEL structure to or near the optical aperture 122. In some implementations, as shown, a portion of the capacitor 132 is over a portion of the active layer 110 of the VCSEL structure. Here, the portion of the active layer 110 over which the capacitor 132 is formed is outside of an active region of the VCSEL structure. The active region of the VCSEL structure corresponds to a portion of the active layer 110 within the oxide aperture 114 (e.g., a portion of the active layer 110 over which the oxide layer 112 is not present). Put another way, the capacitor 132 can be formed over side-surfaces of the VCSEL structure and over a portion of a top surface of the VCSEL structure that is outside of the active region. In some implementations, the overlapped capacitor 132 area is formed in a region that includes an entire surface of the VCSEL chip 100 other than a regions corresponding to apertures of the emitters of the VCSEL chip 100. Notably, in the example implementation shown in FIG. 6, the capacitor layer 124 may be deposited after the top metal layer 130 (e.g., to enable formation of the capacitor 132 extending over the active layer 110 of the VCSEL structure).

In the example implementation shown in FIG. 6, an area of the capacitor 132 is increased, meaning that capacitance can be increased (e.g., as compared to implementations that use the same dielectric material and in which the capacitor 132 does not extend over the active layer 110 outside of the active region of the VCSEL structure). Thus, the implementation shown in FIG. 6 reduces an amount of space on the VCSEL chip 100 that is needed for forming the capacitor 132, thereby enabling the VCSEL chip 100 to have a smaller size and a lower cost (e.g., as compared to an implementation where the capacitor 132 is adjacent to the VCSEL structure and does not overlap the VCSEL structure).

Notably, the example implementation shown in FIG. 6 comprises a dielectric layer 126a and a dielectric layer 126b. In some implementations, the dielectric layer 126a and the dielectric layer 126b may be formed from the same set of materials or from different sets of materials. In some implementations, a type or thickness of one or more layers in the dielectric layer 126b may be selected based on a desired capacitance to be provided by the capacitor 132.

Additionally, if a polarity of the example implementation of the VCSEL chip 100 shown in FIG. 6 uses a tunnel junction or a common anode, the VCSEL chip 100 would outwardly appear the same, while the anode would be on a bottom of the VCSEL chip 100 and the cathode would be on the top of the VCSEL chip 100.

Figure 7:
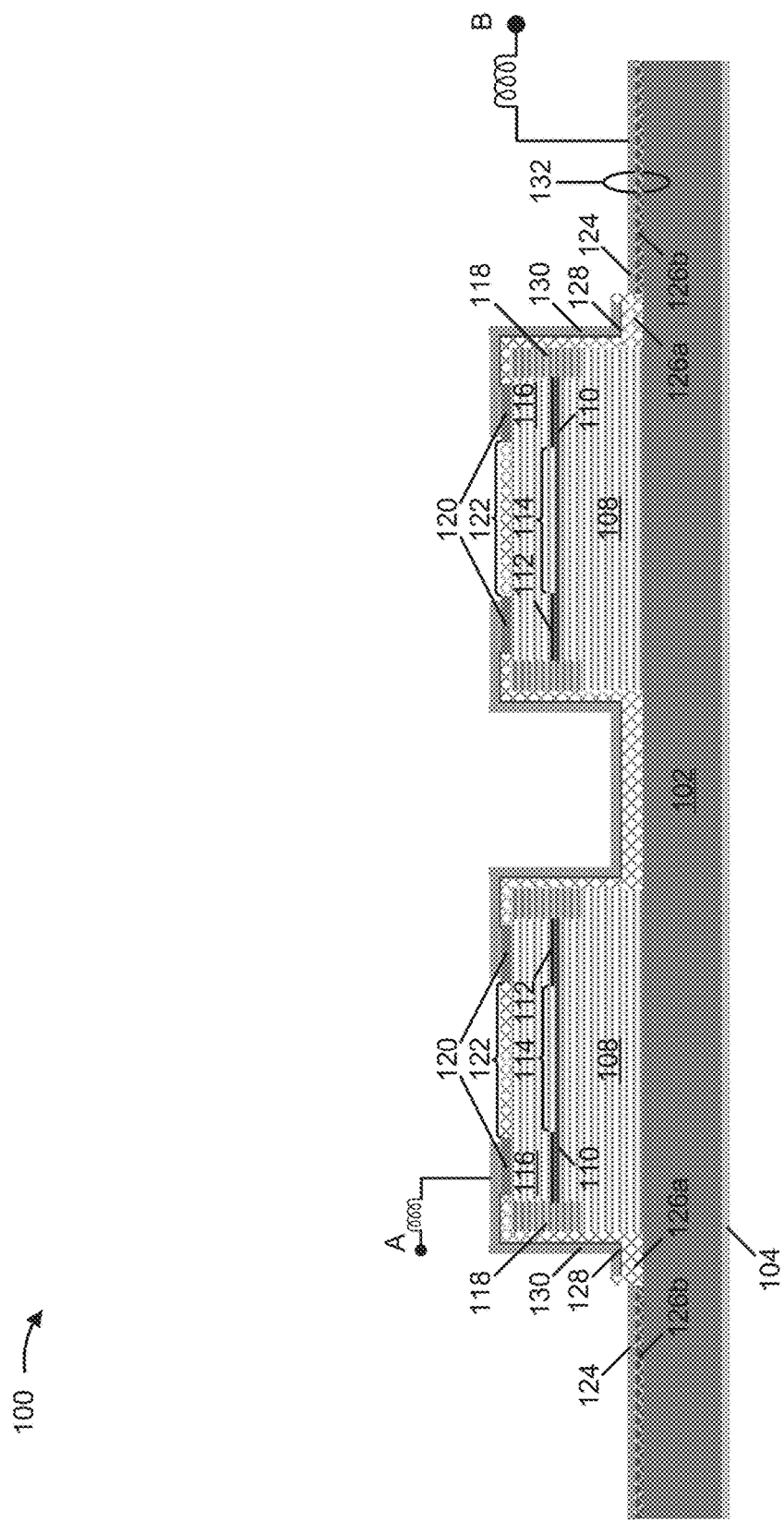

FIG. 7 is a diagram illustrating an example implementation of the VCSEL chip 100 in which the capacitor 132 is integrated at the cathode of the VCSEL chip 100 and is configured in parallel with the array of VCSEL structures of the VCSEL chip 100, where the cathode 104 is at the bottom of the VCSEL chip 100. Notably, in the example implementation shown in FIG. 7, the capacitor 132 is formed from the capacitor layer 124, the dielectric layer 126b, and the substrate 102. Here, a cathode capacitor access on the surface of the VCSEL chip 100 enables access to the cathode capacitor 132 at point B.

Notably, in such a configuration, the capacitor 132 needs to be formed in all regions of the VCSEL chip 100 other than the emitter region of the VCSEL chip 100 in order to enable size and cost reduction. Thus, a comparatively larger area adjacent to an emitter region may be needed to realize the capacitor 132. Here, the capacitor 132 may require the material of the dielectric layer 126b to be selected to enable a size of the substrate 102 to be reduced (e.g., to avoid significantly increasing an area of the VCSEL chip 100).

Figure 8:
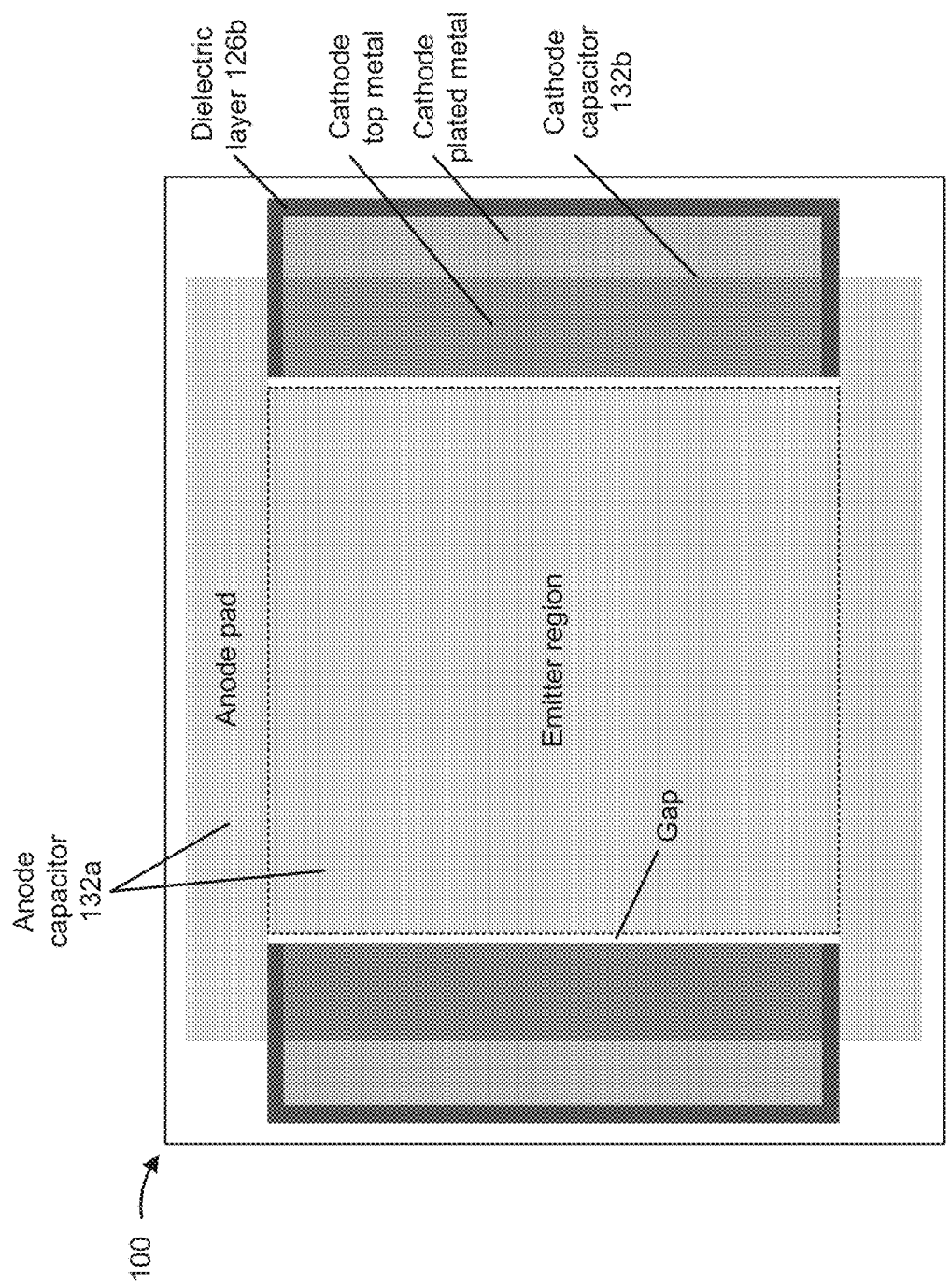
Figure 9:
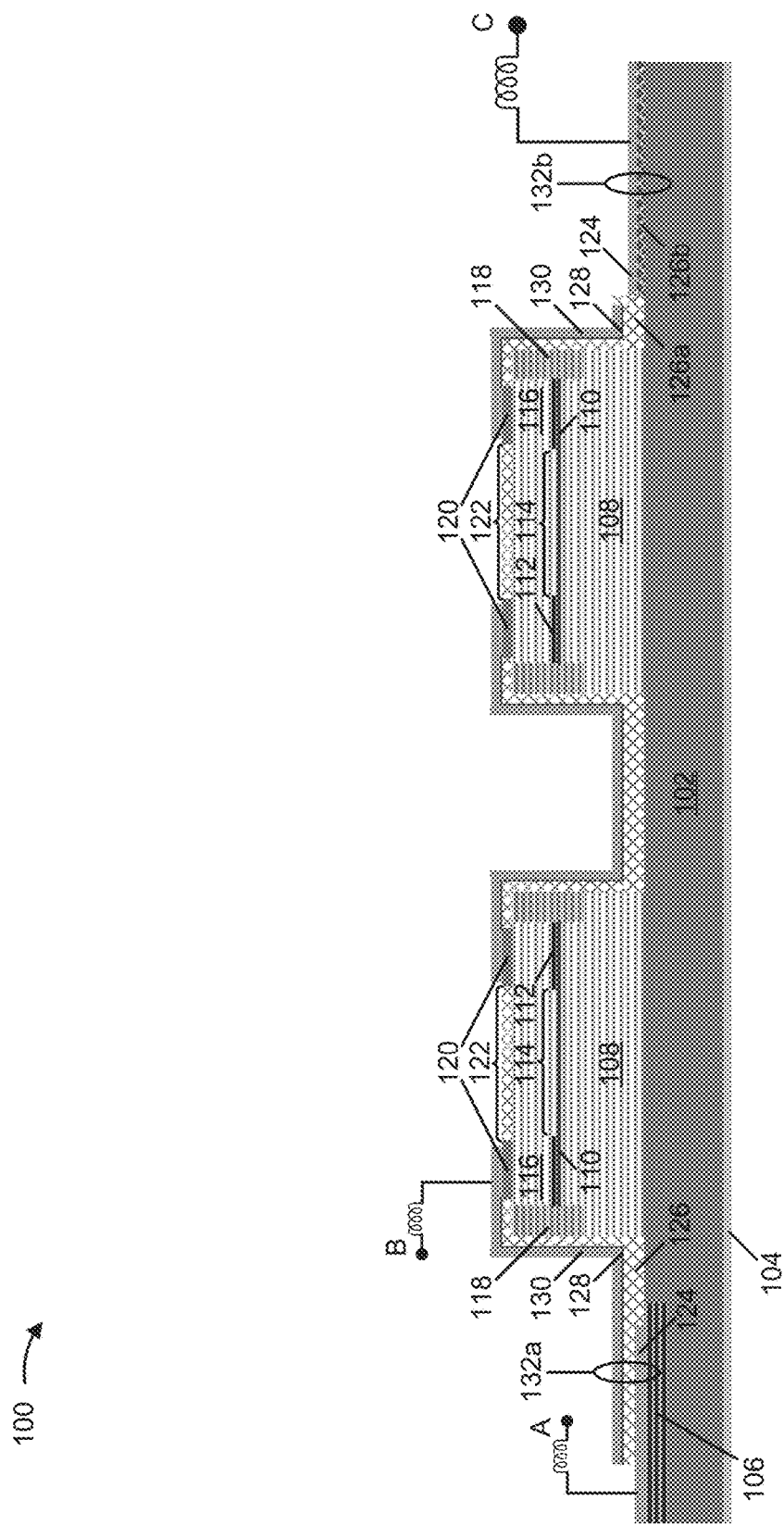

FIGS. 8 and 9 are diagrams illustrating an example implementation of the VCSEL chip 100 in which a capacitor 132a is integrated at the anode of the VCSEL chip 100 and a capacitor 132b is integrated at the cathode of the VCSEL chip 100. FIG. 8 is a diagram illustrating a configuration that can define an anode capacitor 132a and a cathode capacitor 132b. Here, an area under the anode pad and the emitter region define the anode capacitor 132a, and areas under the cathode top metal and the cathode plated metal define the cathode capacitor 132b. Notably, as shown in FIG. 8, gaps are present such that the anode and cathode of the VCSEL chip 100 are not connected. FIG. 8 is a diagram illustrating an example top view of the VCSEL chip 100 associated with the cross-section shown in FIG. 9. Notably, in the example implementation shown in FIGS. 8 and 9, the capacitor 132a is formed from the capacitor layer 124, the dielectric layer 126a, and the top metal layer 130, while the capacitor 132b is formed from the capacitor layer 124, the dielectric layer 126b, and the substrate 102. The inclusion of the capacitor 132a at the anode of the VCSEL chip 100 and the capacitor 132b at the cathode of the VCSEL chip 100 may be desirable to enable, for example, complex operation including biasing and tuning.

The number, arrangement, thicknesses, order, symmetry, or the like, of layers shown in FIGS. 5-9 are provided as examples. In practice, the VCSEL chip 100 may include additional layers, fewer layers, different layers, differently constructed layers, differently arranged layers, or layers of different relative thickness than those shown in FIGS. 5-9. Additionally, or alternatively, a set of layers (e.g., one or more layers) of the VCSEL chip 100 may perform one or more functions described as being performed by another set of layers of the VCSEL chip 100 and, in practice, any layer may comprise more than one layer.

FIGS. 10A-10D, 11A, and 11B are diagrams associated with example steps for fabrication of the capacitor 132 in the VCSEL chip 100. FIGS. 10A-10D illustrate the example steps from a top view of the VCSEL chip 100.

Figure 10A:
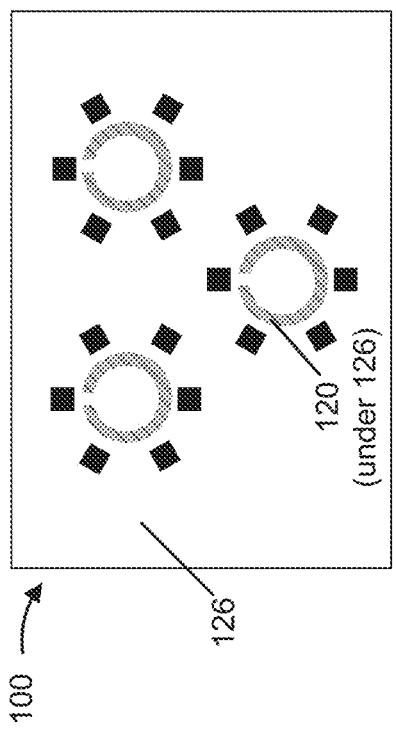

As shown in FIGS. 10A-10D, an array of VCSEL structures is formed in the VCSEL chip 100. As shown in FIG. 10A, the VCSEL chip 100 may include, after a first set of operations, a contact layer 120, trenches (identified as black rectangular shapes in FIG. 10A), and a dielectric layer 126. Here, the dielectric layer 126 is over the contact layer 120.

Figure 10B:
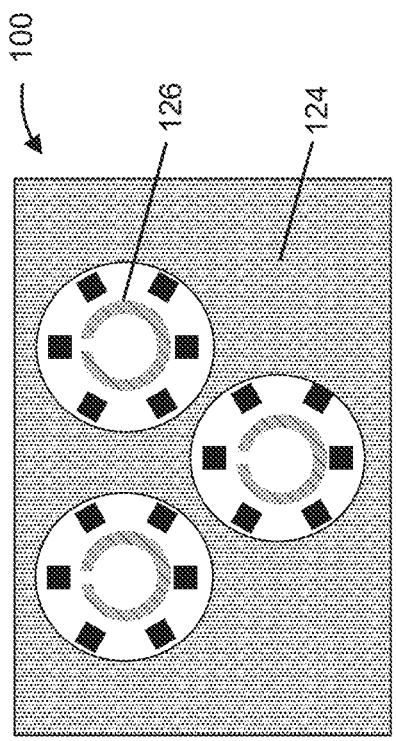

As further shown in FIG. 10B, in a second set of operations, the capacitor layer 124 is formed around the VCSEL structures of the VCSEL chip 100. That is, the capacitor layer 124 may be deposited in a region adjacent to the VCSEL structures of the VCSEL chip 100. As described below, the region in which the capacitor layer 124 is formed is a region in which the capacitor 132 is integrated in the array of VCSEL structures of the VCSEL chip 100.

Figure 10C:
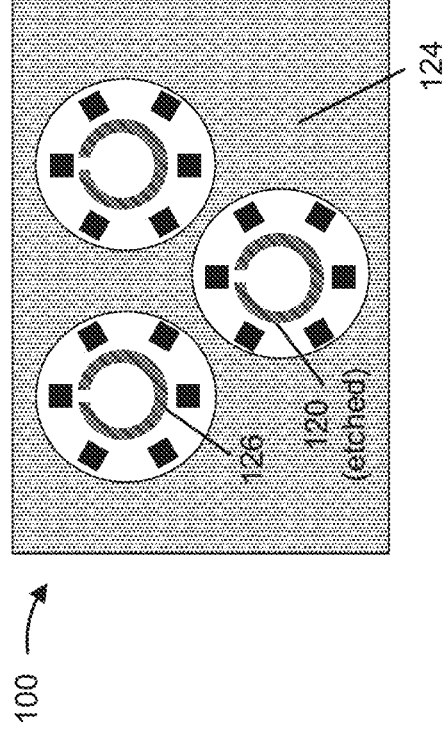

As further shown in FIG. 10C, in a third set of operations, the dielectric layer 126 may be etched to expose a portion of the contact layer 120. For example, vias may be etched in the dielectric layer 126 over the contact layer 120 to expose the portions of the contact layer 120 (e.g., such that the top metal layer 130 can make electrical contact with the contact layer 120).

Figure 10D:
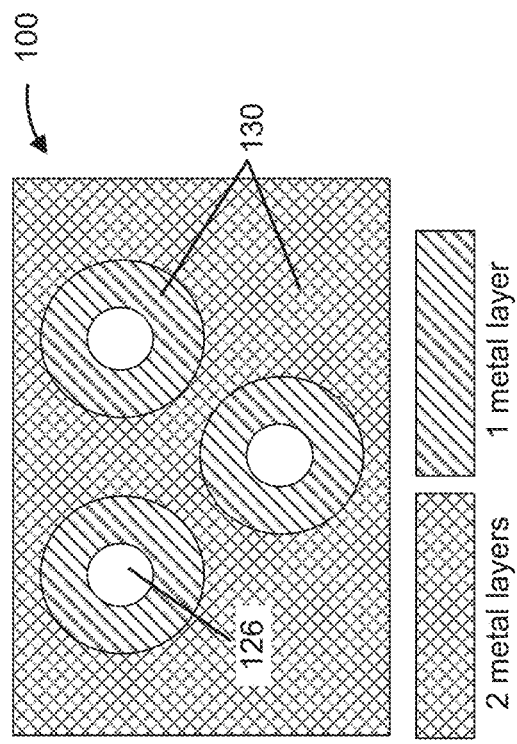

As further shown in FIG. 10D, in a fourth set of operations, the top metal layer 130 may be formed over the capacitor layer 124 and over regions including the exposed portions of the contact layer 120. As indicated, only one metal layer—the top metal layer 130—is present in regions immediately surrounding remaining exposed portions of the dielectric layer 126 (e.g., regions comprising top surfaces and side surfaces of the VCSEL structures of the VCSEL chip 100) after formation of the top metal layer 130. Conversely, two metal layers—the capacitor layer 124 and the top metal layer 130—are present in other regions of the VCSEL chip 100 (e.g., regions adjacent to the VCSEL structures of the VCSEL chip 100) after formation of the top metal layer 130. Here, the capacitor 132 is formed in these other regions of the VCSEL chip 100 (e.g., regions in which the capacitor layer 124 is formed).

In some implementations, a series of operations similar to those described in association with FIGS. 10A-10D may be performed to form the capacitor layer 124 in regions under bond pads or across an entirety of the VCSEL chip 100 between VCSEL structures.

FIG. 11A illustrates a top view of a layout of the VCSEL chip 100 and FIG. 11B illustrates a cross-section on the line "cs" at a particular VCSEL structure of the VCSEL chip 100 after formation of the capacitor 132 using a series of operations similar to those described in association with FIGS. 10A-10D.

In one practical example, using the example process described in association with FIGS. 10A-10D, the VCSEL chip 100 has an area of approximately 0.3 square millimeters (mm$^2$) with approximately 512 VCSEL structures (e.g., emitters) and the dielectric layer 126 has thickness of approximately 0.1 microns (μm) and is formed from titanium dioxide (e.g., a material with a dielectric constant of approximately 100). In this example, the capacitor 132 achieves a capacitance of approximately 3 nanofarads (nF).

As indicated above, FIGS. 10A-10D, 11A, and 11B are provided as examples. Other examples may differ from what is described with regard to FIGS. 10A-10D, 11A, and 11B.

Notably, availability of high dielectric materials and related fabrication processes to provide sufficient capacitance for the capacitor 132 within a particular amount of area of the VCSEL chip 100 may be limited. Although the area of the metal layers that form the capacitor 132 (e.g., the capacitor layer 124 and the top metal layer 130) can be extended beyond an emitter region of the VCSEL chip 100 (e.g., a region in which VCSEL structures of the VCSEL chip 100 are formed), a cost of the VCSEL chip 100 may in such cases be increased in order to achieve a desired capacitance. An alternative approach is to include a high dielectric material in the dielectric layer 126 in order to increase capacitance within an area in which the capacitor 132 is formed.

Figures 12A, 12B, 12C:
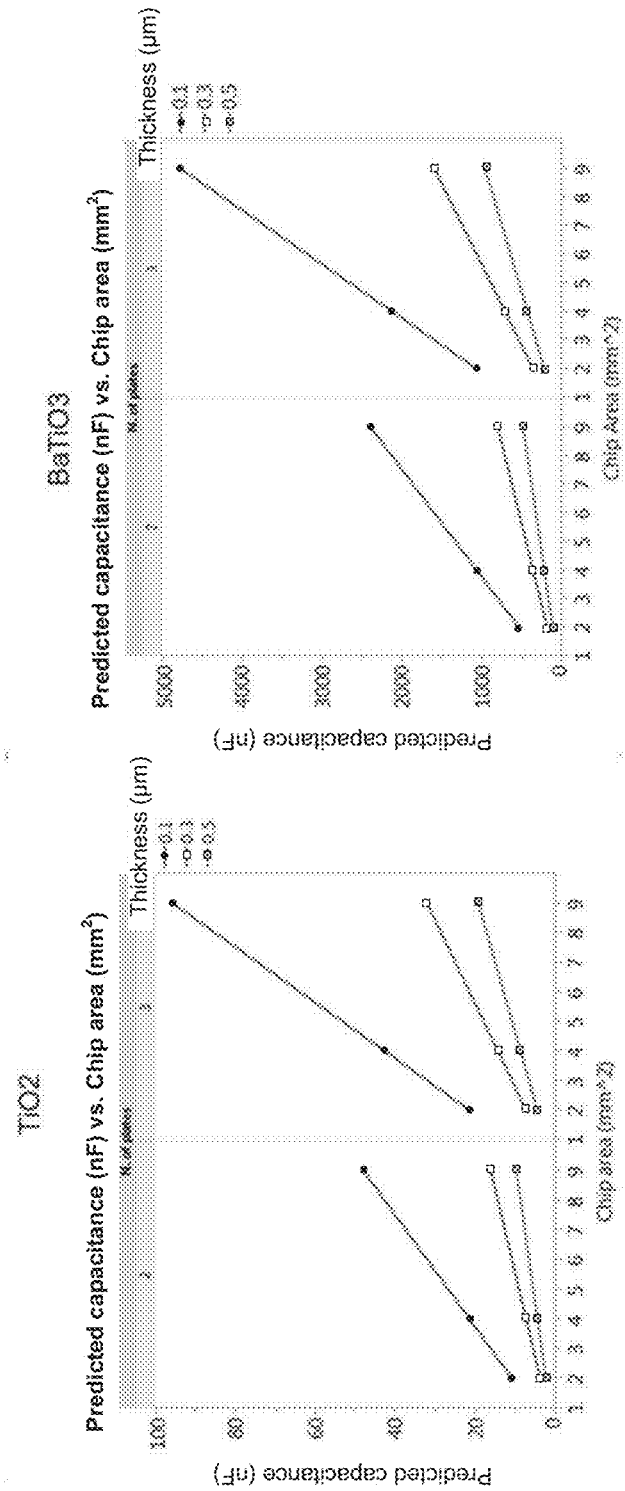
FIG. 12 illustrates characteristics of example high dielectric materials that can be used in association with forming the integrated capacitor described herein.

FIGS. 12A-12C illustrate characteristics of example high dielectric materials that can be used in association with form the capacitor 132. FIG. 12A shows a table listing examples of materials that may be included in the dielectric layer 126 used to form the capacitor 132, and the dielectric constant of such materials. FIG. 12B depicts a predicted capacitance of capacitor 132 (e.g., a MIM) versus an available area for different dielectric thicknesses for $TiO_2$ and FIG. 12C depicts a predicted capacitance of capacitor 132 (e.g., a MIM) versus an available area for different dielectric thicknesses for $BaTiO_3$. As can be seen in FIGS. 12B and 12C, sufficient capacitance for the capacitor 132 is viable within a size of the VCSEL chip 100 when the dielectric layer 126 used to form the capacitor 132 is a high dielectric material such as $TiO_2$ or $BaTiO_3$. In some implementations, the capacitor 132 can be in the form of multiple metallic layers, where the capacitance is shown on the right section of the diagrams in FIGS. 12B and 12C that shows three metallic layers in the form of MIMIM to support higher capacitance. Notably, the predicted capacitance described above is an estimated capacitance based on a selected prorated factor (e.g., 0.8) to reflect performance degradation due to temperature, voltage, and aging effects.

As indicated above, FIGS. 12A-12C are provided as examples. Other examples or high dielectric materials may differ from what is described with regard to FIGS. 12A-12C.

Figure 13A:
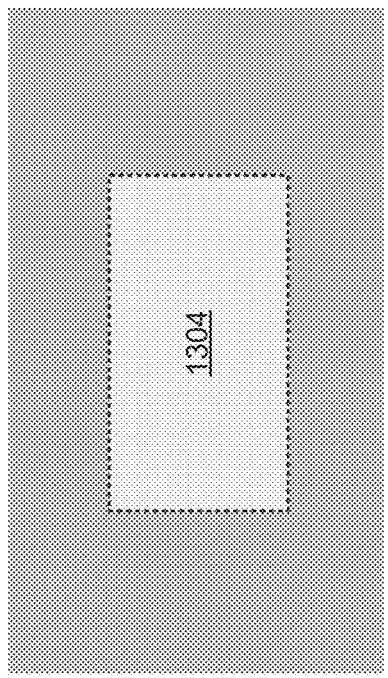
FIGS. 13 and 14 illustrate example implementations of a VCSEL chip in which a capacitor is a discrete component that is integrated with the VCSEL chip.
Figure 13B:
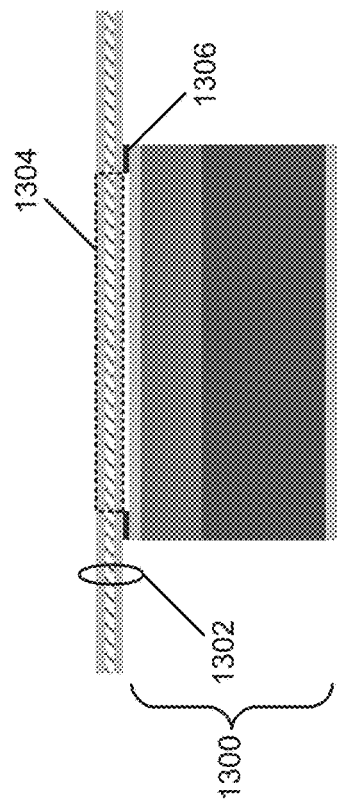
Figure 14:
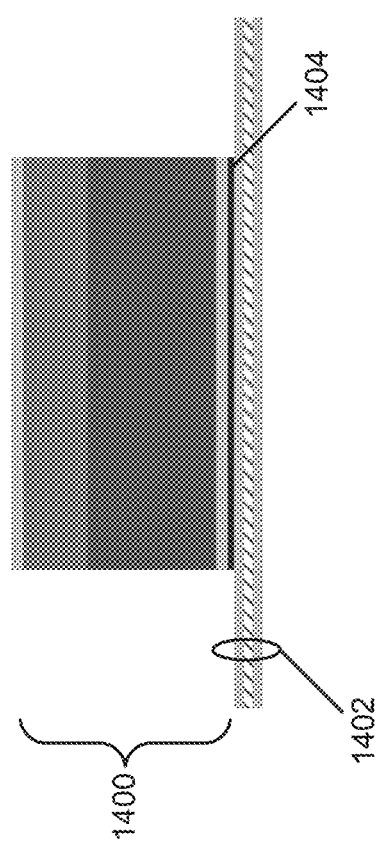

FIGS. 13A, 13B, and 14 illustrate example implementations of a VCSEL chip in which a capacitor is a discrete component that is integrated with (e.g., mounted on) the VCSEL chip. As shown in the top view diagram of FIG. 13A, a capacitor 1302 (e.g., a parallel plate ceramic capacitor) may comprise a cavity 1304. As shown by the side view diagram in FIG. 13B, the capacitor 1302 can be mounted on a VCSEL chip 1300 (e.g., on a top metal layer of the VCSEL chip 1300, which may comprise a typical VCSEL structure) using a conductive adhesive 1306 (e.g., such that the discrete capacitor 1302 is attached to the VCSEL chip 1300). Here, the size of the cavity 1304 is designed to permit lasing emission of the VCSEL chip 1300 (e.g., such that the cavity 1304 is over an emission region of the VCSEL chip 1300). Such a configuration is similar to the VCSEL chip 100 with the capacitor 132 integrated on the anode of the VCSEL chip 100. In some implementations, optical lenses can be mounted on top of the cavity 1304 for optical signal conditioning or processing. In some implementations, multiple layer MIMs can be used to provide sufficient thickness for optical focus. The function of the structure shown in FIGS. 13A and 13B is similar to that of the anode capacitor implementation described above.

Alternatively, as shown in FIG. 14, a capacitor 1402 can be mounted on the bottom of a VCSEL chip 1400 (e.g., on a bottom metal layer of the VCSEL chip 1400, which may comprise a typical VCSEL structure) using a conductive adhesive 1404. Such a configuration is similar to the VCSEL chip 100 with the capacitor 132 integrated on the cathode of the VCSEL chip 100. For backend lasing VCSEL, a cavity similar to 1304 may be needed to enable lasing through the capacitor 1402.

As indicated above, FIGS. 13A, 13B, and 14 are provided as examples. Other examples may differ from what is described with regard to FIGS. 13A, 13B, and 14.

Figure 15A:
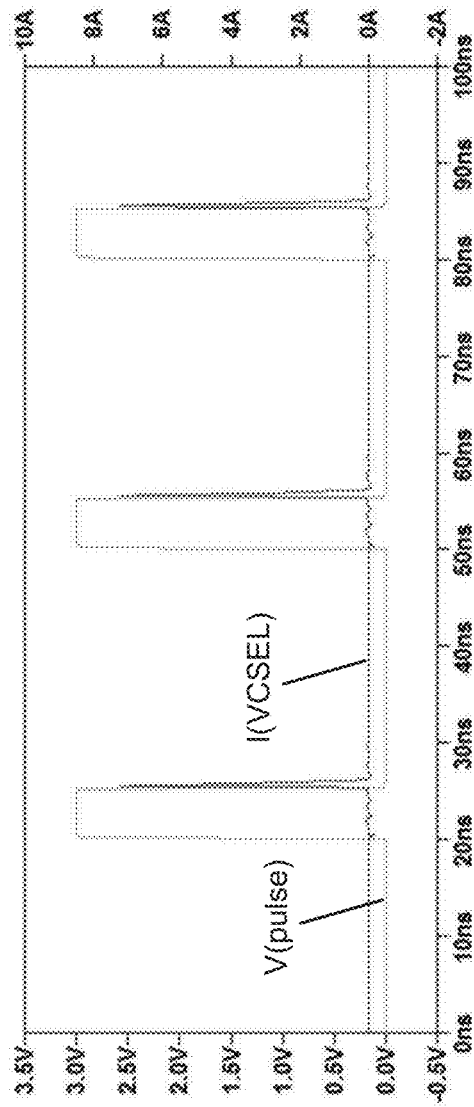
FIG. 15 includes diagrams illustrating simulation results associated with a VCSEL chip with an integrated capacitor configured in series with the VCSEL chip, as described herein.
Figure 15B:
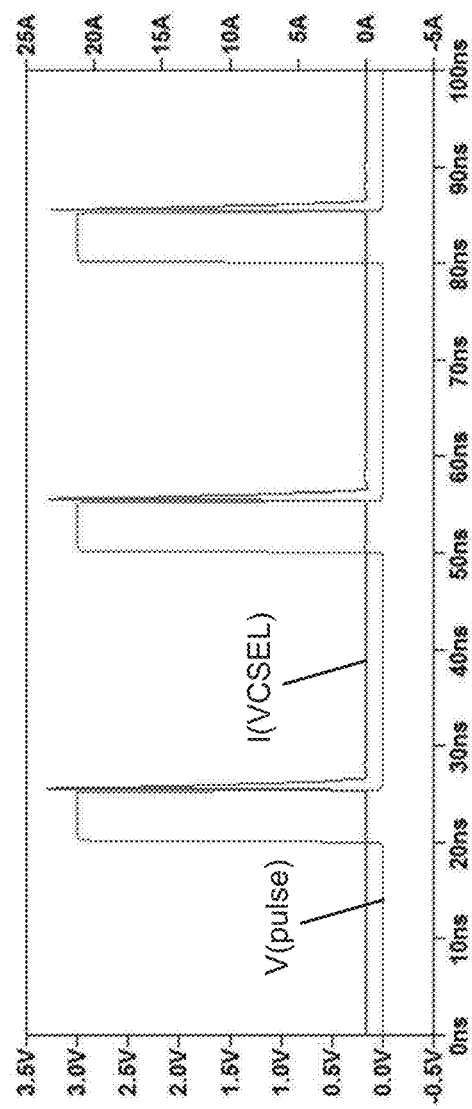

FIGS. 15A and 15B include diagrams illustrating simulation results associated with a VCSEL chip 100 with the capacitor 132 configured in series with the VCSEL chip 100. In the simulations associated with FIGS. 15A and 15B, the capacitor 132 is integrated in series with the anode of the VCSEL chip 100. Further, in the diagrams shown in FIGS. 15A and 15B, V (pulse) is a pulse voltage and I (Vcsel) is a current for the VCSEL chip 100. The diagram in FIG. 15A illustrates response times in a scenario in which a resistance associated with controlling an operating current of the VCSEL chip 100 is set to a value of 0.05 Ohms, for example. The diagram in FIG. 15B illustrates response times in a scenario in which the resistance associated with controlling the operating current of the VCSEL chip 100 is adjusted to a different value in association with controlling the operating current of the VCSEL chip 100 (the resistance value used to control the operating current is dependent on the type of VCSEL and driver circuit). As can be seen from the diagrams in FIGS. 15A and 15B, the VCSEL chip 100 with the capacitor 132 integrated at the anode can achieve a sub-nanosecond pulse response with high current operation even in the presence of additional resistance from controlling the operating current.

As indicated above, FIGS. 15A and 15B are provided as examples. Other examples may differ from what is described with regard to FIGS. 15A and 15B.

Figure 16:
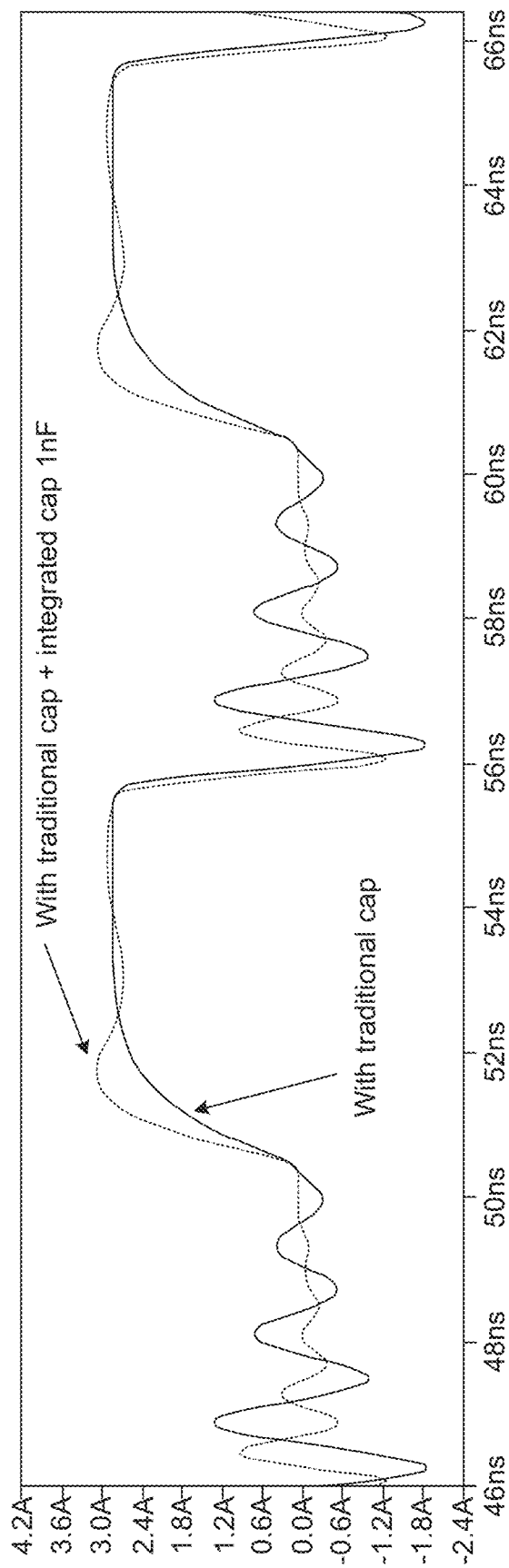
FIG. 16 includes a diagram illustrating simulation results associated with a VCSEL chip with an integrated capacitor configured in parallel with the VCSEL chip, as described herein.

FIG. 16 is a diagram illustrating simulation results associated with a VCSEL chip 100 with the capacitor 132 configured in parallel with the VCSEL chip 100. In the simulation associated with FIG. 16, the capacitor 132 is integrated with the anode of the VCSEL chip 100. The simulation results shown in FIG. 16 illustrate that faster rise times can be achieved for the VCSEL chip 100 with the integrated capacitor 132 arranged in parallel with the VCSEL chip 100 as compared to a VCSEL chip that does not include an integrated capacitor.

As indicated above, FIG. 16 is provided as an example. Other examples may differ from what is described with regard to FIG. 16.

Figure 17:
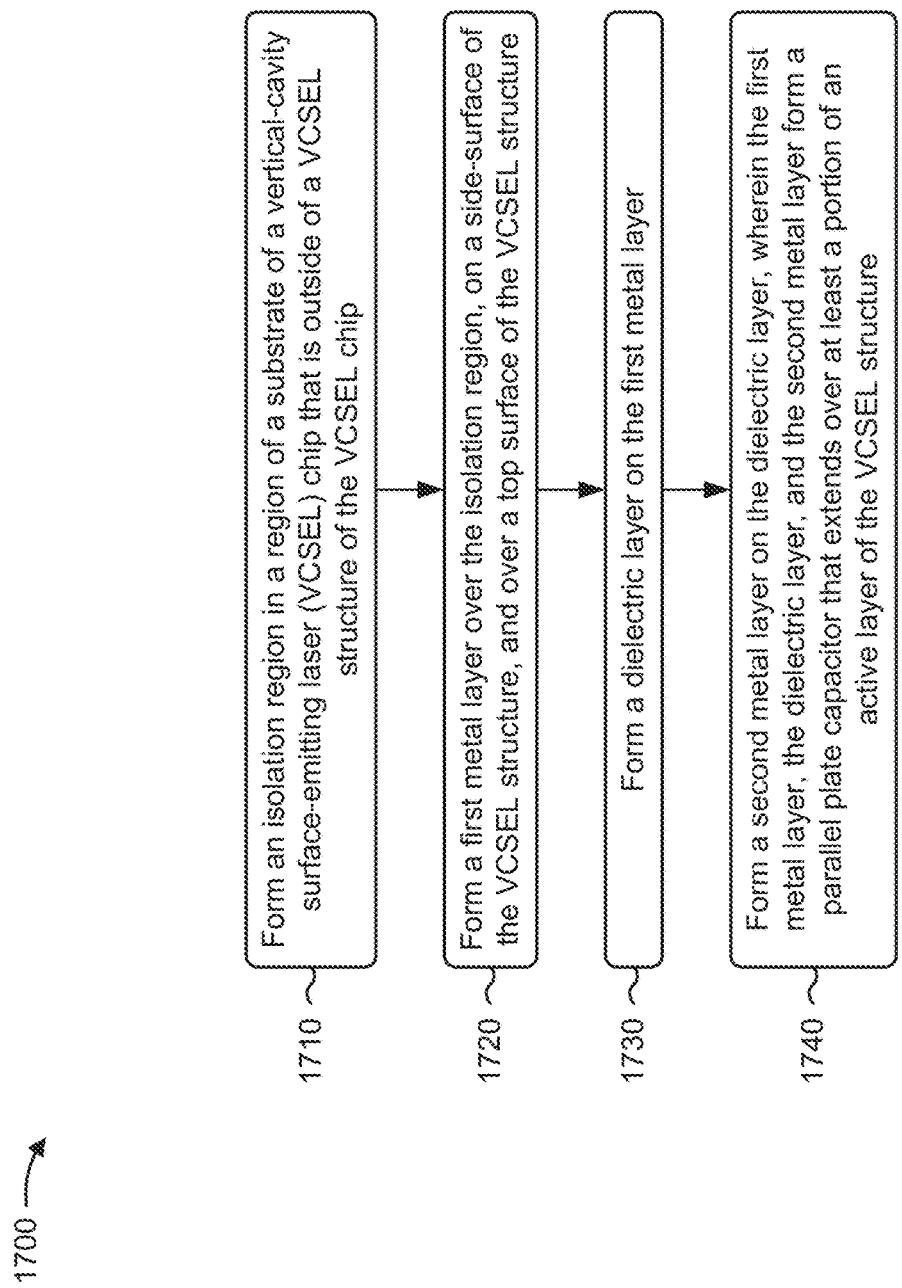
FIG. 17 is a flowchart of an example process associated with forming a VCSEL chip including an integrated capacitor, as described herein.

FIG. 17 is a flowchart of an example process 1700 associated with forming the VCSEL chip 100 including the capacitor 132 described herein.

As shown in FIG. 17, process 1700 may include forming an isolation region in a region of a substrate of a VCSEL chip that is outside of a VCSEL structure of the VCSEL chip (block 1710). For example, an isolation region (e.g., the isolation region 106) may be formed in a region of a substrate (e.g., the substrate 102) of a VCSEL chip (e.g., the VCSEL chip 100) that is outside of a VCSEL structure of the VCSEL chip, as described above.

As further shown in FIG. 17, process 1700 may include forming a first metal layer over the isolation region, on a side-surface of the VCSEL structure, and over a top surface of the VCSEL structure (block 1720). For example, a first metal layer (e.g., the capacitor layer 124) may be formed over the isolation region, on a side-surface of the VCSEL structure, and over a top surface of the VCSEL structure, as described above.

As further shown in FIG. 17, process 1700 may include forming a dielectric layer on the first metal layer (block 1730). For example, a dielectric layer (e.g., the dielectric layer 126) may be formed on the first metal layer, as described above.

As further shown in FIG. 17, process 1700 may include forming a second metal layer on the dielectric layer, wherein the first metal layer, the dielectric layer, and the second metal layer form a parallel plate capacitor that extends over at least a portion of an active layer of the VCSEL structure (block 1740). For example, a second metal layer (e.g., the top metal layer 130) may be formed on the dielectric layer, wherein the first metal layer, the dielectric layer, and the second metal layer form a parallel plate capacitor (e.g., the capacitor 132) that extends over at least a portion of an active layer (e.g., the active layer 110) of the VCSEL structure, as described above.

Process 1700 may include additional implementations, such as any single implementation or any combination of implementations described below and/or in connection with one or more other processes described elsewhere herein.

In a first implementation, the first metal layer is formed such that the first metal layer is connected to a contact layer (e.g., the contact layer 120) of the VCSEL structure.

In a second implementation, alone or in combination with the first implementation, the first metal layer extends to or near an optical aperture (e.g., an optical aperture 122) of the VCSEL structure.

Although FIG. 17 shows example blocks of process 1700, in some implementations, process 1700 may include additional blocks, fewer blocks, different blocks, or differently arranged blocks than those depicted in FIG. 17. Additionally, or alternatively, two or more of the blocks of process 1700 may be performed in parallel.

As described above, the VCSEL chip 100 with the integrated capacitor 132 described herein enables various driving methodologies with faster switching time, high current ultra-short pulse, and/or improved driving efficiency. Further, in some implementations, the VCSEL chip 100 with the integrated capacitor 132 described herein may be utilized for anode-push operation, cathode-pull operation, or both anode-push/cathode-pull operations. In some implementations the VCSEL chip 100 with the integrated capacitor 132 described herein may be utilized in such operations for providing capacitance that is greater than approximately 100 picofarads (pF).

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An optical chip, comprising:
 a substrate;
 a vertical-cavity surface-emitting laser (VCSEL) structure, the VCSEL structure including:
  a first electrode over a first portion of an active layer of the VCSEL structure, and
  a second electrode below the substrate;
 an isolation region in the substrate; and
 a capacitor on the isolation region and over at least a second portion of the active layer of the VCSEL structure that is outside of an active region, the capacitor including:
  a first metal layer directly on the isolation region,
  a dielectric layer on the first metal layer, and
  a second metal layer on the dielectric layer and over the second portion of the active layer,
 wherein the isolation region is configured to provide isolation between the capacitor and the substrate.

2. The optical chip of claim 1, wherein a portion of the second metal layer of the capacitor is on a side-surface of the VCSEL structure.

3. The optical chip of claim 1, wherein a portion of the second metal layer of the capacitor is on a top surface of the VCSEL structure.

4. The optical chip of claim 1, wherein a portion of the capacitor is on a surface adjacent to the VCSEL structure.

5. The optical chip of claim 1, wherein a portion of the second metal layer is on a contact layer of the VCSEL structure.

6. The optical chip of claim 1, wherein the second metal layer of the capacitor extends to or near an optical aperture of the VCSEL structure.

7. The optical chip of claim 1, wherein the isolation region reduces current leakage from the capacitor to the substrate.

8. The optical chip of claim 1, wherein the capacitor is integrated with an anode of the VCSEL structure.

9. The optical chip of claim 1, wherein the capacitor is connected in series with the VCSEL structure.

10. The optical chip of claim 1, wherein the capacitor is a first capacitor and is integrated with the first electrode of the VCSEL structure, and the optical chip further comprises a second capacitor integrated with the second electrode of the VCSEL structure.

11. The optical chip of claim 1, wherein the dielectric layer is a first dielectric layer, and the capacitor further includes a second dielectric layer on the second metal layer and a third metal layer on the second dielectric layer.

12. A device, comprising:
a substrate;
a vertical-cavity surface-emitting laser (VCSEL) array, the VCSEL array including:
a first electrode over a portion of an active region of a VCSEL structure of the VCSEL array, and
a second electrode below the substrate;
an isolation region in the substrate; and
a capacitor integrated with the first electrode of the VCSEL array, the capacitor comprising a first portion, a second portion, and a third portion,
wherein the first portion of the capacitor is over a portion of a top surface of the VCSEL structure of the VCSEL array that is outside of the active region of the VCSEL structure,
wherein the second portion of the capacitor is on a side surface of the VCSEL structure of the VCSEL array, and
wherein the third portion of the capacitor is directly on the isolation region,
wherein the isolation region is configured to provide isolation between the third portion of the capacitor and the substrate of the VCSEL array.

13. The device of claim 12, wherein the capacitor is a parallel plate capacitor or a multiple parallel plate capacitor comprising a plurality of metal layers and one or more dielectric layers.

14. The device of claim 12, wherein the first portion of the capacitor extends to or near an optical aperture of the VCSEL structure.

15. The device of claim 12, wherein the capacitor is integrated with a cathode of the VCSEL structure.

16. The device of claim 12, wherein the capacitor is connected in parallel with the VCSEL structure.

17. The device of claim 12, wherein the capacitor is a first capacitor, and the device further comprises a second capacitor integrated with the second electrode of the VCSEL array.

18. A method, comprising:
forming an isolation region in a region of a substrate of a vertical-cavity surface-emitting laser (VCSEL) chip that is outside of a VCSEL structure of the VCSEL chip;
forming a first metal layer directly on the isolation region, on a side-surface of the VCSEL structure, and over a top surface of the VCSEL structure;
forming a dielectric layer on the first metal layer; and
forming a second metal layer on the dielectric layer,
wherein the first metal layer, the dielectric layer, and the second metal layer form a parallel plate capacitor that extends over at least a portion of an active layer of the VCSEL structure, and
wherein the isolation region in the region of the substrate of the VCSEL structure is configured to provide isolation between the parallel plate capacitor and the substrate.

19. The method of claim 18, wherein the first metal layer is formed such that the first metal layer is connected to a contact layer of the VCSEL structure.

20. The method of claim 18, wherein the first metal layer extends to or near an optical aperture of the VCSEL structure.

* * * * *